(12) United States Patent
Komatsu et al.

(10) Patent No.: US 7,208,781 B2
(45) Date of Patent: Apr. 24, 2007

(54) SEMICONDUCTOR DEVICE HAVING FUSES

(75) Inventors: Yukio Komatsu, Kanagawa-ken (JP);
Hajime Koyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 254 days.

(21) Appl. No.: 10/941,030

(22) Filed: Sep. 15, 2004

(65) Prior Publication Data

US 2005/0098803 A1 May 12, 2005

(30) Foreign Application Priority Data

Sep. 16, 2003 (JP) .............................. 2003-322584

(51) Int. Cl.
*H01L 29/73* (2006.01)
*H01L 29/00* (2006.01)

(52) U.S. Cl. ............... 257/209; 257/528; 257/E21.592; 257/E23.149

(58) Field of Classification Search ................. 257/258, 257/528, 529, E21.592, E23.149, 209
See application file for complete search history.

(56) References Cited

U.S. PATENT DOCUMENTS 5,459,684 A * 10/1995 Nakamura et al. .......... 365/149
2002/0125576 A1 9/2002 Koyama et al.
2003/0154456 A1* 8/2003 Koike et al. ................... 716/8

* cited by examiner

*Primary Examiner*—Long K Tran
(74) *Attorney, Agent, or Firm*—Foley & Lardner LLP

(57) ABSTRACT

A semiconductor device which includes fuses for relieving defective areas in the semiconductor device is described. There is provided a semiconductor device including a semiconductor substrate having a circuit element, an insulating layer provided on the semiconductor substrate, a fuse element formed in the insulating layer, the fuse element including at least two fuse units connected in series, each of the fuse units having a resistor and a fuse connected in parallel, the fuse disposed above the resistor.

12 Claims, 8 Drawing Sheets

SEMICONDUCTOR DEVICE HAVING FUSES

CROSS REFERENCE TO RELATED APPLICATION

This application is based upon and claims the benefit of priority from the prior Japanese Patent Application No.2003-322584, filed on Sep. 16, 2003; the entire contents of which are incorporated herein by reference.

FIELD OF THE INVENTION

The present invention relates to a highly integrated semiconductor device, and in particular, to a semiconductor device which includes fuses for relieving defective areas in the semiconductor device.

DESCRIPTION OF THE BACKGROUND

As a semiconductor devices are desired to have higher density integration, a circuit design technology due to a scaling rule has been developed to accommodate a smaller size. As large scale integration in a semiconductor device, such as a DRAM in particular, is continuing to develop a size reduction, a scaling rule of circuit design is remarkably significant.

In order to realize higher density and larger scale integration in a device chip, a redundancy technique has been developed. This technique allows recovery from a defective area in the device chip by substituting the defective area with a redundant circuit provided provisionally.

From a practical perspective, it is difficult to manufacture a LSI memory device without defective memory cells. In an ordinary semiconductor storage device, defective memory cells are identified by a die sorting test and then the defective memory cells are substituted by redundant portions.

As the capacity of a semiconductor device increases, defective bits in the semiconductor device also increase. As a result, it is necessary to increase a number of fuses for relieving the defective bits. In order to obtain a required manufacturing yield rate, it is necessary to relieve the defective bits below predetermined numbers by the fuses In practice, at least several hundreds of defective bits may be relieved by the fuses.

For example, in a large capacity DRAM, about 10,000 fuses are provided in the device chip. When a storage capacity of the device chip increased twice as much under the same design rule, the chip area is also doubled. Thus, physical effects caused by a substance such as small dusts on memory cells become significant. As a result, the defective bits may Increase. Further, as a scaling rule of circuit design proceeds, the same dust can cause more semiconductor elements to be defective. Consequently, the defective bits increase.

In order to substitute the defective area with a redundant circuit, nonvolatile memory elements, such as fuse circuits, are provided preliminarily in the device chip. The specified fuse circuit corresponding to the defective area is blown out by irradiating the fuse circuit with a laser beam. Consequently, only the specified fuse is cut off.

FIG. 7 is a perspective view showing a structure of fuses provided in a conventional semiconductor device. In FIG. 7, four fuses F51 to F54 are formed in the structure. Fuses F51 and F53 are cut off by irradiation with a laser beam, on the other hand fuses F52 and F54 are not cut off and are still intact.

The fuses F51 and F53 blown out by the laser irradiation are used for, for example the storage state, "1". On the contrary, fuses F52 and F54 are used for, for example the storage state, "0". By storing the stage state of "1" or "0" in the four figures, it is possible to store the fourth power of 2, i.e., 16 bits in the device.

It is considered that an area of fuses may be reduced by reducing a size of a fuse. However, because of a limitation to a precision of focal position of laser irradiation by a laser used for blowing a fuse and a constraint in a spot diameter of a laser beam, it is difficult to set the laser beam narrower than a certain width. Thus, further reducing an area of fuses would be difficult.

U.S. Patent Application Publication No. 20020125576 discloses a semiconductor storage device having a smaller fuse area. In this semiconductor storage device, a thickness of each fuse is varied by changing irradiation conditions such as irradiation energy or irradiation time.

Since a resistance value of a fuse is inversely proportioned to the thickness of the fuse, the thicker the fuse is, the smaller its resistance value is. Further, the thinner the fuse is, the larger its resistance value is. Bit information is defined corresponding to various resistance values of the fuses. By changing the thickness of a fuse and its resistance value, it is possible to obtain multiple-valued information more than three bits from the fuse element.

FIG. 8 is a perspective view of arrangement of four fuses F61, F62, F63 and F64 in a conventional fuse elememt F60. A laser-irradiated portion 51 of first fuse F61 is removed by laser irradiation such that only end portions 52 of fuse F61 remains. In this state, for example, "0" information is stored in the fuse. The laser irradiated portion 51 of second fuse F62 has comparatively thicker thickness than that of first fuse F61, and third fuse F63 has comparatively thinner thickness than that of second fuse F62. On the other hand, a fourth fuse F64 is not irradiated. In fuse element 60, four resistance values are formed in a stepped manner. In this manner, four bits per one fuse are provided, and it is possible to store the fourth power of 4, i.e., 256 bits in the fuse element of the device. Thus, the fuse area of the device may become smaller than that of the binary system.

However, the multiple-value technique mentioned above requires employment of various laser irradiation conditions, which are difficult to achieve. Accordingly, it is difficult to perform a redundancy in a device with lower cost and higher repeatability.

SUMMARY OF THE INVENTION

According to an aspect of the present invention, there is provided a semiconductor device including, a semiconductor substrate having a circuit element, an insulating layer provided on the semiconductor substrate, a fuse element formed in the insulating layer, the fuse element including at least two fuse units connected in series, each of the fuse units having a resistor and a fuse connected in parallel, the fuse disposed above the resistor.

According to another aspect of the present invention, there is provided a semiconductor device including, a semiconductor substrate having a circuit element, an insulating layer provided on the semiconductor substrate, a fuse element formed in the insulating layer, having at least two resistors and at least two fuses, the resistors formed of a first conductive line, connected in series, the fuses formed of a second conductive line, connected in series and disposed above the resistor, a contact element configured to connect between each of the two resistors and each of the two uses.

DETAILED DESCRIPTION OF THE INVENTION

Embodiments of the present invention will be described below in detail with reference to the drawings mentioned above.

A first embodiment of the present invention is hereinafter explained with reference to FIGS. 1, 2, 3 and 4. A semiconductor device of the first embodiment is a high density memory device having fuse elements.

Figure 1A:
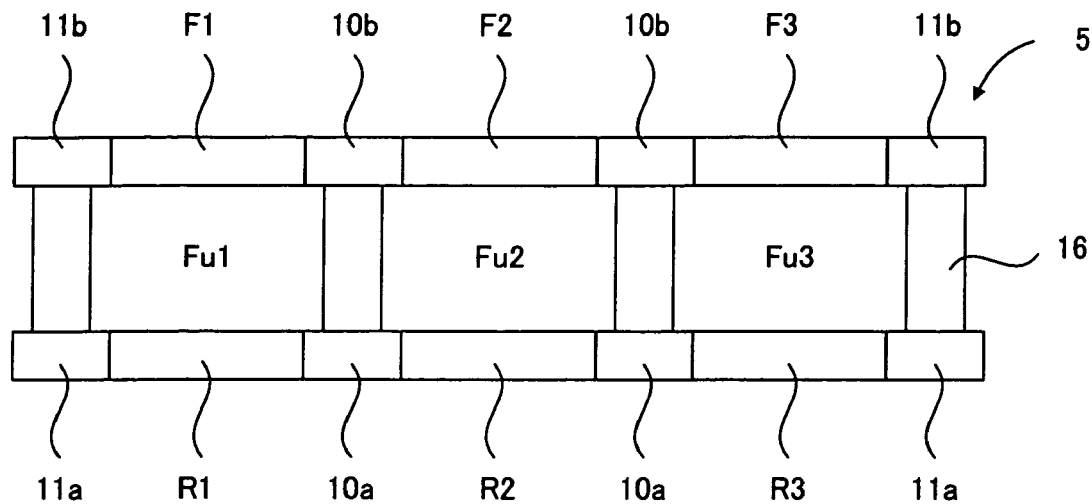
FIG. 1A is a schematic front view of a fuse element according to a first embodiment of the present invention.
Figure 1B:
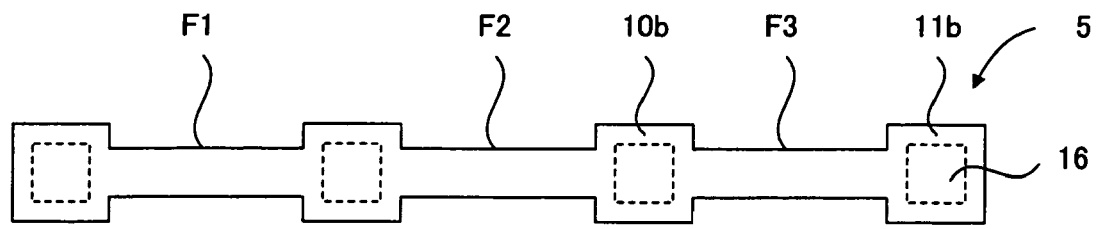
FIG. 1B is a schematic plane view of the fuse element from the upper side according to the first embodiment of the present invention.
Figure 1C:
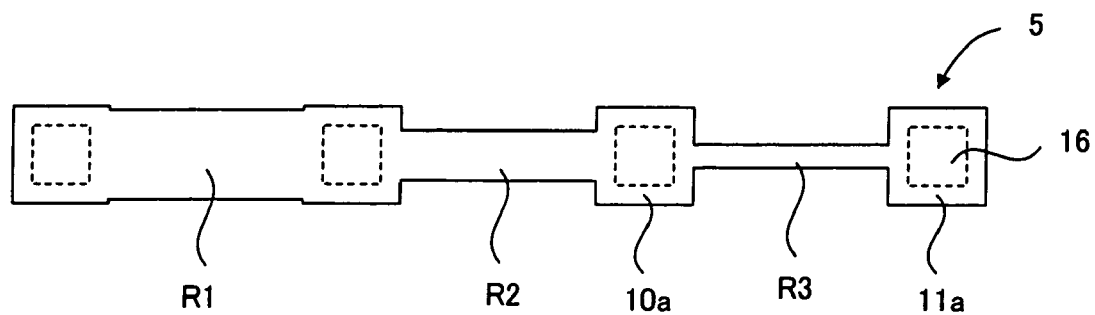
FIG. 1C is a schematic plane view of the fuse element from the bottom side according to the first embodiment of the present invention.

FIG. 1A is a front schematic view showing a fuse elememt in the semiconductor device. FIG. 1B is a plane schematic view from the upper side of a semiconductor substrate (not illustrated in the figure) showing the fuse elememt in the semiconductor device. Moreover, FIG. 1C is a plane view from the bottom side of the semiconductor substrate showing the fuse elememt in the semiconductor device. Same reference numbers are shown or same portions to the extent convenient in the figures.

As shown in FIG. 1A, in the semiconductor device of the first embodiment, a fuse element 5 has a three fuse units Fu1, Fu2 and Fu3 connected in series. Each of three fuse units Fu1, Fu2 and Fu3 has a fuse and a resistor, respectively. Each of fuses F1, F2 and F3 and each of resistors R1, R2 and R3 are connected in parallel, respectively.

Resistors R1, R2 and R3 may be formed of a first conductive wiring in a shape of a straight line in the coplanar layer through contacts 10a. Resistors R1, R2 and R3, contacts 10a, and contact pads 11a at both end portions of the straight line are made of a silicon film doped with impurities. In this embodiment, moreover, resistors R1, R2 and R3 have the same thickness and the same length.

Fuses F1, F2 and F3 are formed of a second conductive wiring above resistors R1, R2 and R3, and are connected in a shape of a straight line in the coplanar through contacts 10b. Fuses F1, P2 and F3, contacts 10b, and contact pads 11b at both end portions of the straight line may have a sandwich structure, in which Al—Cu alloy disposed between Ti/TiN layers. Fuses F1, F2 and F3, contacts 10b, and contact pads 11b at both ends of the straight line have the same thickness. Each of fuses F1, F2 and P3 has the same length.

Moreover, resistors R1, R2 and R3 and contacts 10a are arranged directly above fuses F1, F2 and F3 and contacts 10b, respectively. Contacts 10a and 10b, and contact pads 11a and 11b are connected with contact plugs 16 made of Al—Cu alloy, respectively. In other words, fuse F1 and resistor R1, a fuse F2 and resistor R2, and fuse F3 and resistance R3 are connected in parallel via contact plugs 16, respectively. Fuse F1 and resistor R1, fuse F2 and resistor R2, and fuse F3 and resistor R3 form fuse units Fu1 to Fu3, respectively. Fuse units Fu1, Fu2 and Fu3 are connected in series.

In addition, contacts 10a and 10b have the same shape of contact pads 11a and 11b, however, contacts 10a and 10b may be formed smaller than contact pads 11a and 11b. Contact pads 11a and 11b at the both end portions of fuse elememt 5 are connected to a readout circuit by a wiring layer (not illustrated in the figure). Storage information on fuse elememt 5 is transmitted to the readout circuit through contact pads 11a and 11b.

Typically, resistance values of fuses F1, F2 and F3 are designed to be lower than resistance values of resistors R1, R2 and R3 by two digits or more. As shown in FIG. 1B, fuses F1, F2 and F3 have the same width. On the contrary, as shown in FIG. 1C, resistor R1, resistor R2 and resistor R3 have the widest width, the middle sized width and the narrowest width, respectively. Since resistors R1, R2 and R3 are typically made of the same material and have the same thickness, the resistance values r1, r2 and r3 corresponding to resistors R1, R2 and R3, respectively, are inversely proportional to the width of resistors R1, R2 and R3. Therefore, in FIG. 1C, the resistance values of the resistors R1, R2 and R3 are set to r1<r2<r3.

When none of fuses F1, F2 and F3 are cut off, a resistance of fuse element 5 is dominated by the resistance of the fuse connected in parallel, and the resistance value of fuse element 5 indicates the resistance of the fuses, which is almost near zero.

On the other hand, when each one of fuses F1, F2 and F3 is blown out, the resistance of the fuse becomes infinitely large. For this reason, the resistance value of resistors R1, R2 and R3 governs the resistance of fuse element 5.

Figure 2:
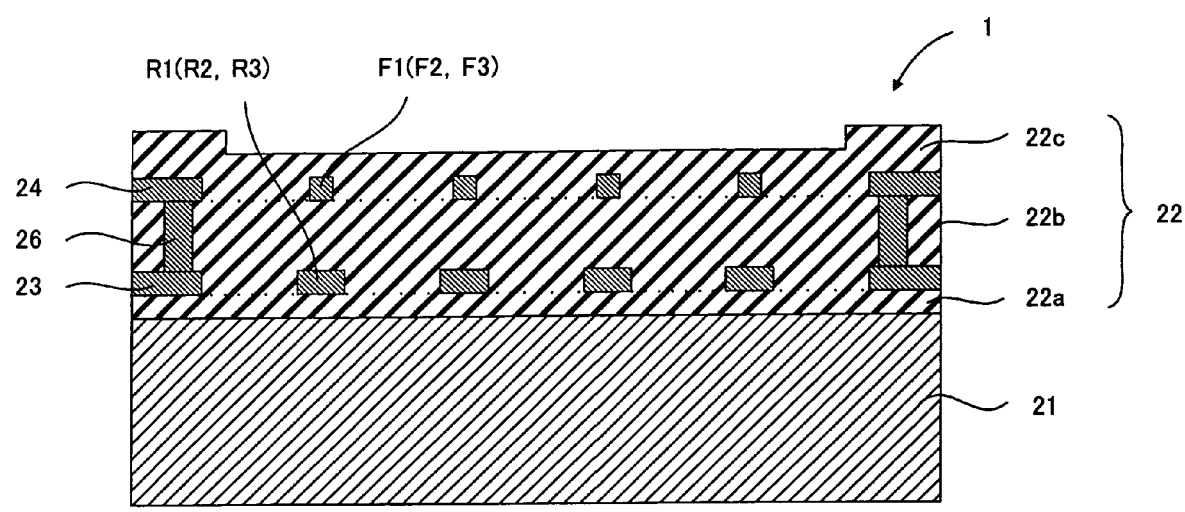
FIG. 2 is a schematic cross-sectional view of a semiconductor device for explaining a device structure according to the first embodiment of the present invention.

FIG. 2 is a cross-sectional view showing a portion of the semiconductor device where fuse elememt 5 in FIG. 1 is incorporated on a semiconductor substrate 21. In FIG. 2, four fuse elememt 5 arranged in parallel between the upper surface and the bottom surface on semiconductor substrate 21.

Four resistors R1 (R2, R3) having predetermined thickness are formed in a layer near semiconductor substrate 21. Four fuses F1 (F2, F3) having predetermined thickness are formed in a layer far from semiconductor substrate 21. These resistors R1 (R2, R3) and fuses F1 (F2, F3) are formed in an insulating film 22, such as a silicon-dioxide film, on semiconductor substrate 21.

Furthermore in detail, circuit elements of, for example, a MOS transistor are separately formed from a fuse circuit in semiconductor substrate 21. On semiconductor substrate 21, a lower wiring, i.e., a first conductive wiring 23 is formed via an insulating film 22a. Resistors R1, R2 and R3, contacts 10a, and contact pads 11a (not illustrated in the figure) are also formed of first conductive wiring 23. First conductive wiring 23 is connected with upper wiring, which is second conductive wiring 24, which is formed on insulating film 22b, through contact plug 26 disposed in insulating film 22b.

Fuses F1, P2 and F3, contacts 10b, and contact pads 11b (not illustrated in the figure) are formed of second conductive wiring 24. Insulating film 22c may be formed on second conductive wiring 24. Furthermore, a protect film etc. (not illustrated in the figure) is formed on insulating film 22c except for the portion above fuses F1, F2 and F3 etc.

In one embodiment, a silicon-dioxide film may be used as insulating film 22c wrapping fuses F1, F2 and F3. The film thickness of insulating film 22c is selected to suit for laser melting conditions.

While this embodiment is described with three kinds of insulating films, however, each of the insulating films may not be limited to a monolayer and same types of an insulating film.

Next, a laser melting of fuse elememt 5 is explained. Fuses F1, F2 and F3 in fuse elememt 5 are irradiated with a laser beam. A beam diameter, an output power, a pulse width, etc. of the laser beam are adjusted by using conventional fuse melting equipment (not illustrated in the figure). A focus of the laser beam may be selected for the optimum condition.

Although insulating film 22c hardly absorbs the laser power, insulating film 22c helps keep temperature of a material to which the laser beam is applied. Fuses F1, F2 and F3 are heated by laser irradiation, consequently, the temperature of the upper region in fuses F1, F2 and F3 rises rapidly. The upper region in fuses F1, F2 and F3 liquefies and eventually, a portion of the liquefied region vaporizes.

As a result, pressure in insulating film 22c rises and the portion of insulating film 22c near the fuse fusion is blown away. Simultaneously, the overheated region in fuses F1, F2 and P3 evaporates, and fuses F1, F2 and F3 are cut off. After the portion of insulating film 22c blank away, the pressure falls to the atmosphere value.

The side and lower portion in fuses F1, F2 and F3 are exposed to the increased pressure mentioned above. Therefore, the horizontal distance between F1, F2 and F3, the perpendicular distance between F1, F2 and F3 and resistors R1, R2 and R3 connected in parallel are important. In order to avoid the problem on the pressure, the perpendicular distance between F1, F2 and F3 and resistors R1, R2 and R3 may be to be increased. For example, resistances R1, R2 and R3 may be formed in the same layer as the lowest layer or near first conductive wiring 23 in a multilevel interconnection structure of the semiconductor device as shown in FIG. 2.

On the other hand, fuses F1, F2 and F3 might be formed of second conductive wiring 24, which is an upper metal wiring in the multilevel interconnection structure.

As the minimum distance may depend on a material and a shape of a fuse, the distance may be empirically obtained through research of the optimal conditions. A structure of the multilevel insulating film 22 alleviates stress as in the perpendicular direction, Consequently, the structure makes it possible to reduce the distance as compared to a case of a monolayer structure.

A storage capacity of the fuse elememt having a fuse and a resistance is explained with reference to FIG. 3. FIG. 3A shows an equivalent circuit of fuse elememt 5. FIG. 3B is a table showing resistances obtained by the fuse cutting and information assigned to the resistances.

Figures 3A, 3B:
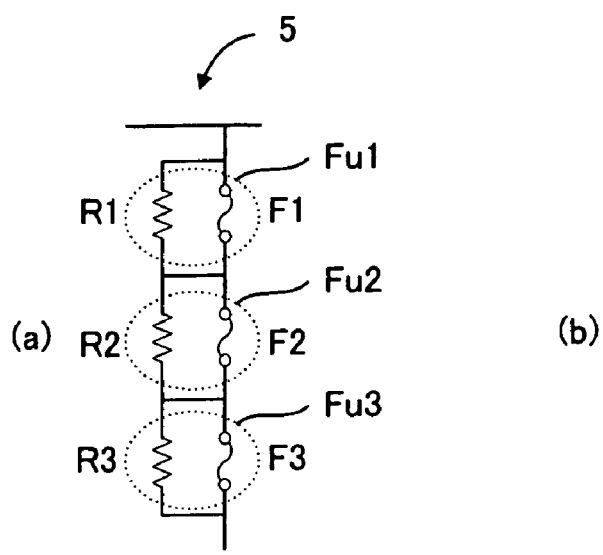
FIG. 3A is an equivalent circuit of the fuse element according to the first embodiment of the present invention.
FIG. 3B illustrates a relationship between a resistance value and a bit according to the first embodiment of the present invention.

As shown in FIG. 3A, in ruse elememt 5, fuse F1 and resistor R1, fuse F2 and resistor R2, fuse F3 and resistor R3 are connected in parallel, respectively. Moreover, as for fuse elememt 5, fuse units Fu1, Fu2 and Fu3 are connected in series.

As compared to resistors R1, R2 and R3, resistance values of fuses F1, F2 and F3 are very low. Accordingly, the resistance values are approximately zero. Each resistance value of resistors R1, R2 and R3 are represented by the symbol r1, r2 and r3, respectively. In one example, resistance values r1, r2 and r3 may be set to r1<r2<r3.

First, where fuses F1, F2 and F3 are not cut off, resistances between both ends of fuse units Fu1, Fu2 and Fu3 formed with fuses F1, F2 and F3 and resistances R1, R2 and R3, respectively, are nearly zero. The total resistance between both ends of fuse elememt 5 combined fuse units Fu1 to Fu3 is also zero.

For example, when only a fuse F1 is cut off, the resistance between both ends of fuse elememt 5 is changed to r1+0+0, thus resulting in the total resistance of r1. In another example, when only a fuse F2 is cut off, the resistance between both ends of fuse elememt 5 is changed to 0+r2+0, thus resulting in the total resistance of r2.

Moreover, in another example, when fuses F2 and F3 are cut off, the resistance between both ends of fuse elememt 5 is changed to 0+r2+r3, thus resulting in the total resistance of r2+r3.

By using the method described above, eight of total resistance value as summarized in FIG. 3b may be obtained. In the case of r1=1 Ω, r2=2 Ω, and r3=4 Ω, eight kinds of the resistance value can be attained with a 1 Ω difference from zero to 7 ohm. A number of triple figures in binary digits can be assigned to eight kinds of the resistance value.

For example, it is possible to assign 000 to resistance 0 and to assign 111 to resistance r1+r2+r3. That is, connecting with fuse units Fu1, Fu2 and Fu3 enables fuse elememt 5 to memorize 8-bit information.

Figure 4A:
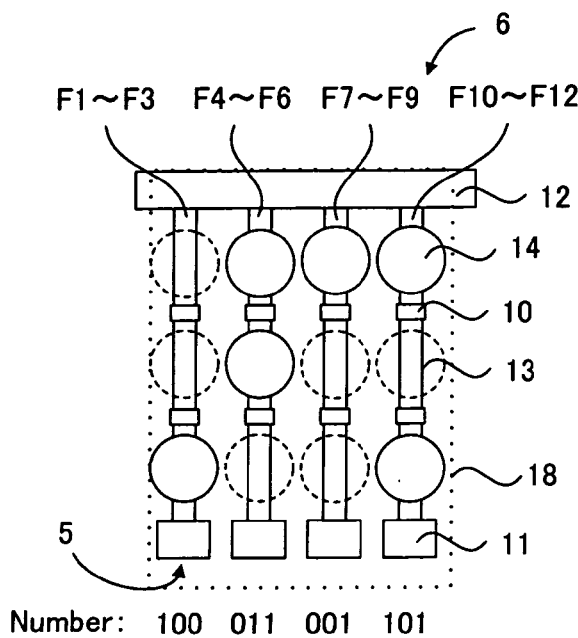
FIG. 4A is a schematic plane view of a fuse element for explaining an occupied area according to the first embodiment of the present invention.

An area improved efficiency obtained by fuse elememt 5 is explained below referring with FIG. 4. FIG. 4A is a block diagram of a fuse elememt 6 which can memorize 12 figures in binary digits. In fuse elememt 6, four fuse elememts 5 (F1 to F3) with multi values are arranged in parallel. One end portion of each fuse elememt 5 is connected to a readout circuit (not illustrated) through a common wiring layer 12, and the other end portion is connected to another readout circuit through each individual wiring (not illustrated) connected to a contact pad 11.

A dashed line circle indicates a fuse 13 that is intact, and a solid line circle indicates a cut fuse 14. Each circle shows schematically a range influenced strongly by the laser melting. In consideration of a margin of a fuse cutting condition, a fuse elememt 6 has an arrangement that an adjoining fuse, a contact and a contact pad, etc. are not affected by a fuse cutting process. Therefore, a minimum area 18 serves as a region shown by the dotted rectangular.

Storage numerical values of fuse elememt 6 are arranged by four 8-bit fuse elememts 5 connected in parallel, as shown in FIG. 4A. For example, each fuse elememt 5 may be set to 100, 011, 001, and 101, thus resulting in totally 4096 kinds of identifications (the 4th power of 8).

Figure 4B:
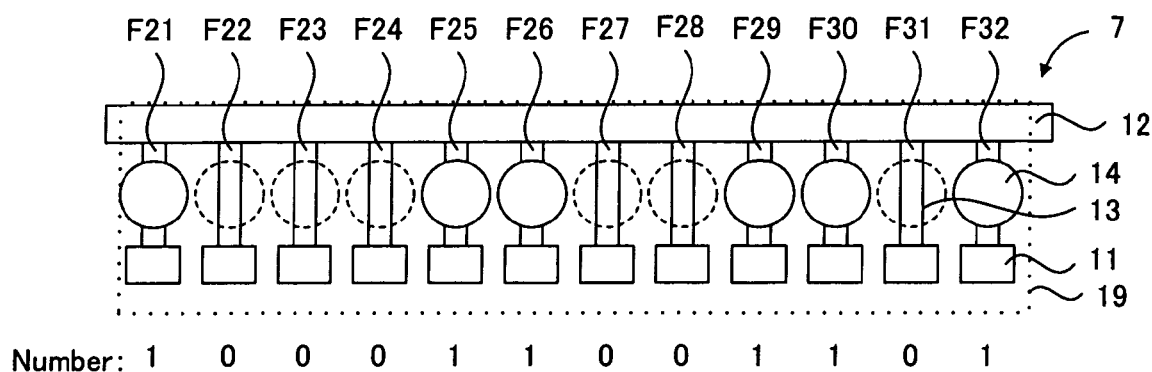
FIG. 4B is a schematic plane view of the fuse element for explaining an occupied area in a conventional device.

On the other hand, as shown in FIG. 4B, a conventional fuse elememt 7 with same storage capacity is formed to put twelve fuses F21, F22, F23, F24, F25, F26, F27, F28, F29, F30, F31 and F32 in order. For example, each fuse elememt 21, 22, 23, 24, 25, 26, 27, 28, 29, 30, 31 and 32 are set to 100011001101, thus resulting in totally 4096 kinds of identifications (the 12th power of 2). One end portion of each fuse elememt 21, 22, 23, 24, 25, 26, 27, 28, 29, 30, 31 and 32 are connected to a readout circuit (not illustrated) through a common wiring layer 12, and the other end portion is connected to another readout circuit through each individual wiring (not illustrated) connected to a contact pad 11. In consideration of a margin of adjusting fuse element, a minimum area 19 serves as a region shown by the dotted rectangular.

The end of fuses F1, F2, F3, F4, F5, F6, F7, F8, F9, F10, F11 and F12 are connected to a readout circuit through the common wiring layer 12 which is connected a contact pad (not illustrated in the figure).

Other edges are connected to a readout circuit through the wiring layer (not illustrated in the figure) connected to the contact pad 11. Therefore, a minimum area 19 occupied by fuse elememt in consideration of separate distance with an adjoining fuse is shown by the dotted line.

As shown in FIG. 4A, contact pads 11 of both end portion of a fuse elememt 5 are connected to a wiring layer in this embodiment. Two contacts 10 located in the middle of fuse element 5 may be used for connection with a contact plug acting as a connection with an adjoining fuse and a connection between a fuse and a downward resistance. Contacts 10 can be formed smaller in size as compared to contact pad 11.

Furthermore, an interval with an adjoining elememt is omissible at contact pad 11 of an end portion of a fuse element. As shown in FIG. 4(b), each fuse elememt is separately arranged in a conventional case, however, three fuse elememts 5 are combined in this embodiment.

Moreover, taking into consideration on a fuse elememt and a wiring layer on the outside, reduction of an individual wiring layers linked to a readout circuit may be achieved in the fuse elememt of this embodiment. Although twelve wiring layers are required for twelve in conventional fuse elememt 7 as shown in FIG. 4B, only four wiring layers is necessary in fuse elememt 6 of this embodiment, as shown in FIG. 4A. As compared with the conventional case, a wiring layer number can be decreased to ⅓ in this embodiment.

As mentioned above, the reduction of an area of a fuse elememt and a wiring layer may be enable to the reduction an area occupied by a fuse elememt in a semiconductor device to about ⅔ or ½ of a conventional example semiconductor device.

In this embodiment, a conventional fuse melting equipment can be used for fuse cutting, as a fuse requested only for information on the binary. Therefore, it is not necessary to add a special function to a conventional fuse melting equipment.

Moreover, it is not necessary to perform on fuse melting conditions with narrow margins. Consequently, a fuse melting with lower cost and sufficient reproducibility, without a throughput reduction may be possible.

In addition, an area occupied by a fuse element in a semiconductor device may be decreased to about ⅔ to. ½, which leads to an advantage in proceeding larger capacity of a semiconductor device.

A second embodiment of the present invention is hereinafter explained with reference to FIGS. 5 and 6. A semiconductor device of the second embodiment is basically a same memory device having fuse elements as that of the first embodiment.

Figure 5A:
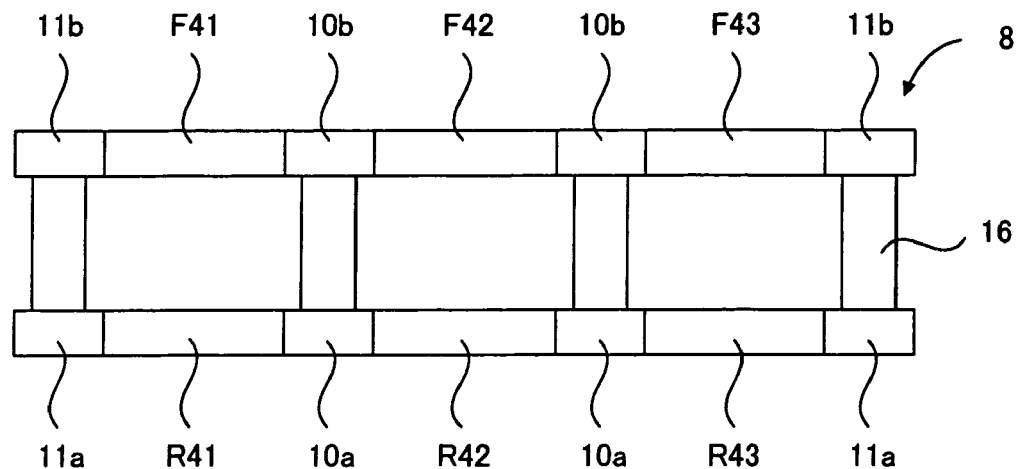
FIG. 5A is a schematic front view of a fuse element according to a second embodiment of the present invention.
Figure 5B:
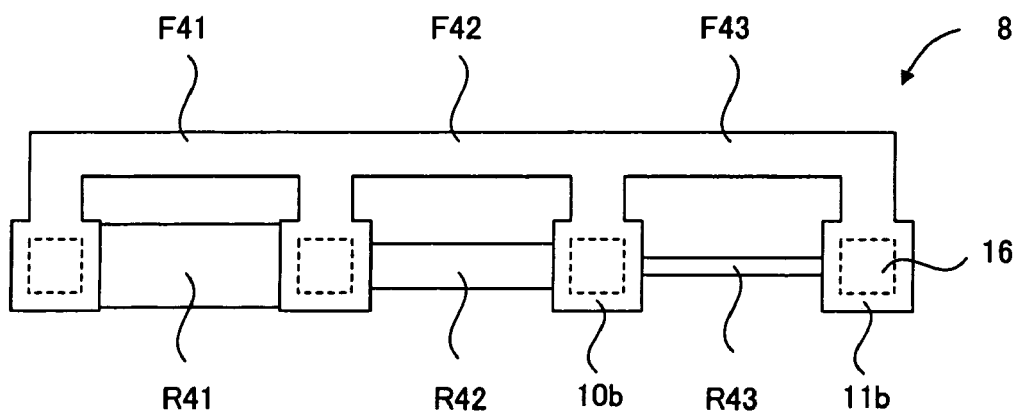
FIG. 5B is a schematic plane view of the fuse element from the upper side of a semiconductor substrate according to the second embodiment of the present invention.
Figure 5C:
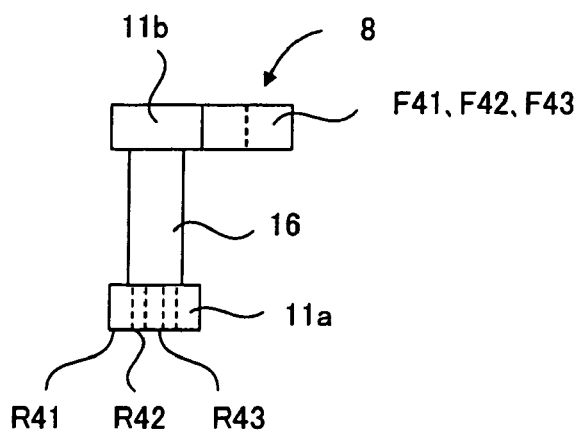
FIG. 5C is a schematic plane view of a fuse element from the bottom side of the semiconductor substrate according to a second embodiment of the present invention.

FIG. 5A is a front schematic view showing a fuse elememt of a semiconductor device. FIG. 5B is a plane schematic view from the upper side of a semiconductor substrate showing the fuse elememt of the semiconductor device. Moreover, FIG. 5C is a plane view from the bottom side of a semiconductor substrate showing the fuse elememt of the semiconductor device. In addition, the same reference numbers are used to indicate the same portions as the first embodiment, and an explanation about the portions is omitted.

The difference between fuse elememt 8 in this embodiment and fuse elememt 5 in the first embodiment can be seemed in the location of fuses F41, P42 and P43 formed in an upper portion of resistors R41, R42 and R43. As shown in FIG. 5B, fuses are located not directly above the resistor, and instead fuses are located at an area horizontally shifted from above resistors R41, R42 and R43.

In order to realize the structure mentioned above, the one end portion of each fuse F41, P42 and F43 is bent towards resistances R41, R42 and R43. Furthermore, the other end portion of each fuse F41, F42 and F43 are extended above contact pads 11a. A contact 10b and a contact pad 11b are arranged in the head of the Dent portion. A contact 10b and a contact pad 11b are connected to contact 10a and contact pad 11a through a contact plug 16, respectively.

As compared to the fuses of the first embodiment, the fuses F41, F42 and F43 have the increased resistance to the extent that they bent are. However, the fuses F41, F42 and F43 are designed such that the resistance of the fuses, even with the increased value, do not affect the total resistance of fuse element 8.

Figure 6:
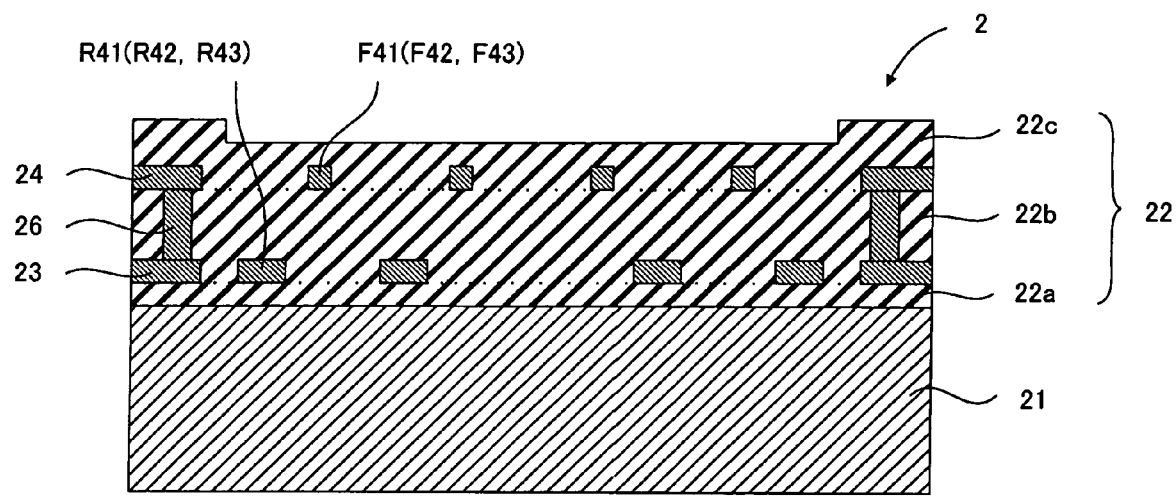
FIG. 6 is a schematic cross sectional view of a semiconductor device for explaining a device structure according to the second embodiment of the present invention.
Figure 7:
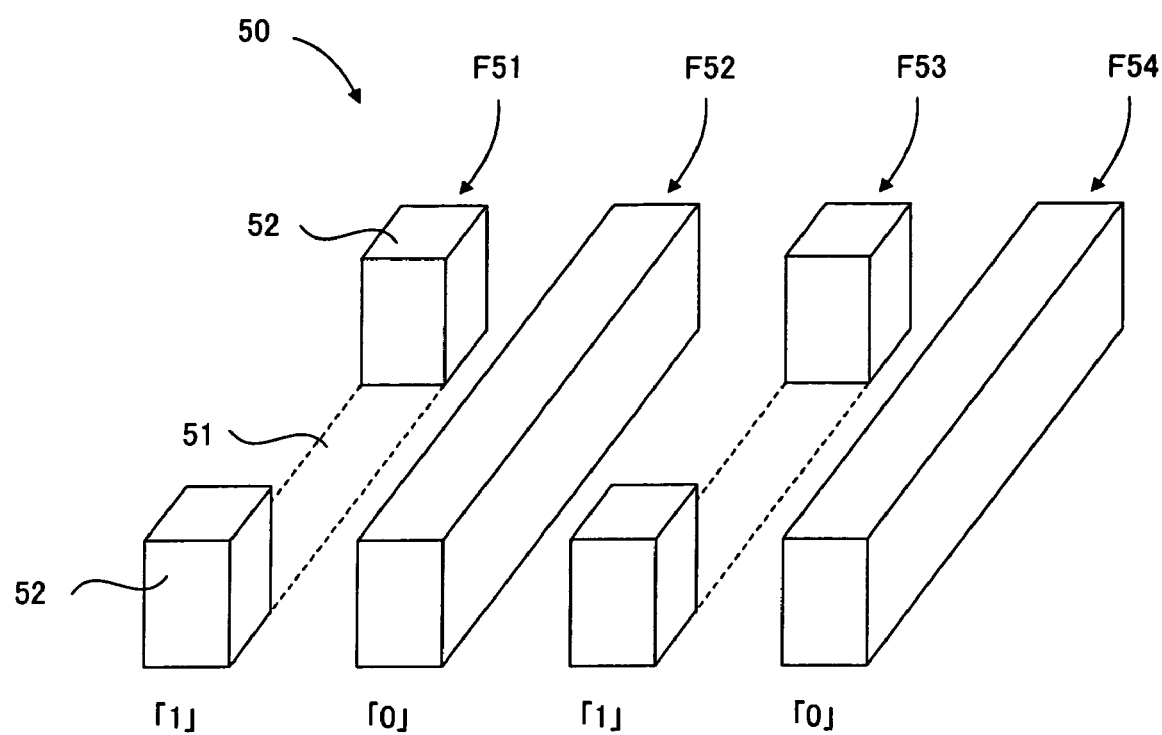
FIG. 7 is a perspective view showing a fuse element provided in a conventional semiconductor device.
Figure 8:
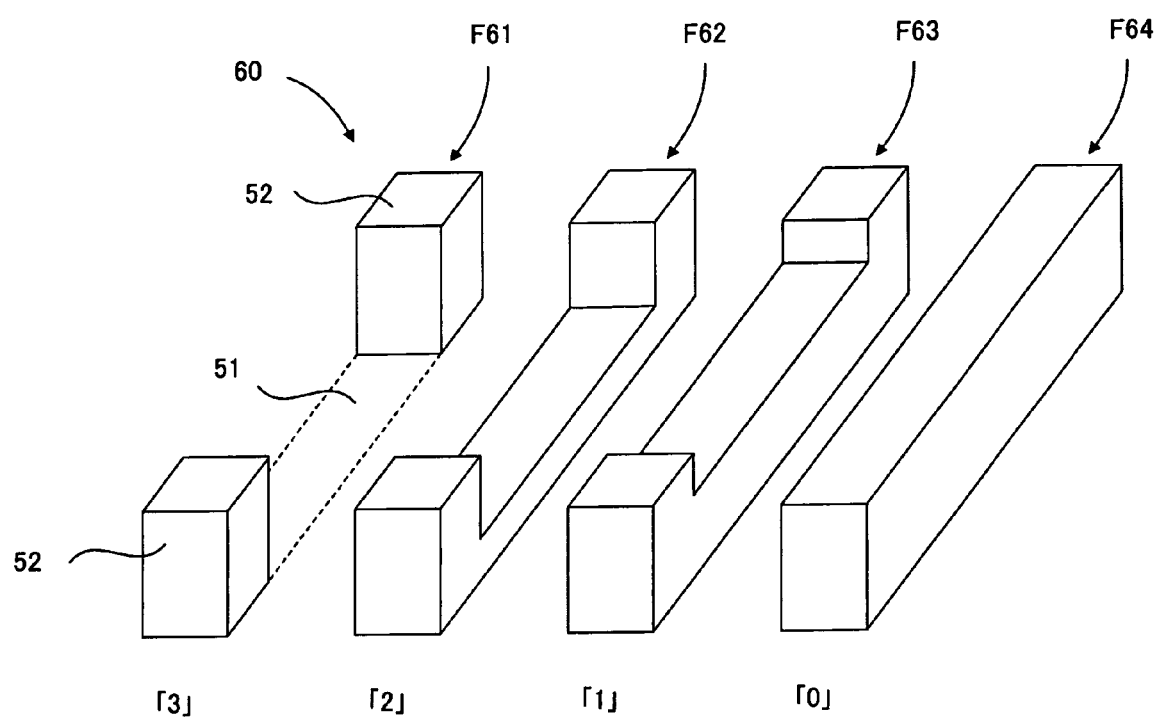
FIG. 8 is a perspective view showing a fuse element provided in a conventional semiconductor device.

FIG. 6 is a cross-sectional view showing a typical structure where fuse elememt 8 is located in a semiconductor device 2 formed on a semiconductor substrate 21. This figure shows four fuse elememts 8 juxtaposed in parallel by the upper surface towards the bottom surface of semiconductor substrate 21. Two fuse elememts 8 shown in FIG. 5C are arranged at the left-hand side of the structure. Another two fuse elememts 8 shown in FIG. 5C are arranged with mirror symmetry of the left-hand side at right-hand side of the structure. The position of a fuse F41 is established in the same position as that of the first embodiment. Consequently, the structure is modified. The position of two resistors R41 at the left-hand side is off to the left as compared with the position of the resistance in the first embodiment, and that of two fuses in the right-hand side fuses 8 is off to the right as compared with that of the fuse in the first embodiment.

In this embodiment, two sets of modified fuse elements are located horizontally at both the left-hand side and the right-side hand. On the other hand, only one set of modified fuse element located in the structure also might be effective.

A semiconductor device according to the second embodiment, has effects, in addition to the effects obtained by the first embodiment.

As the distance between fuse F41 and resistor R41 separates farther away in this embodiment, propagation of the induced stress, a crack, and similar effects is reduced when a laser melting condition is the same as the first embodiment. In other words, the long distance allows a more powerful laser melting condition. A laser process in a short time leads to raise a throughput.

Moreover, since a fuse can be brought close to semiconductor substrate 21, miniaturization of a wiring layer is possible and laser melting becomes easy.

Furthermore, since a fuse and a contact pad can separate widely, it is possible to form a smaller fuse. For this reason, a miniaturization of a fuse elememt is possible and an occupancy area of a fuse elememt in a semiconductor device can be reduced.

Other embodiments of the present invention will be apparent to those skilled in the art from consideration of the specification and practice of the invention disclosed herein. It is intended that the specification and the example embodiments in this disclose be considered as exemplary only, with a true scope and spirit of the invention being indicated by the claims that follow. The invention can be carried out by various modifications within a range not deviated from the gist of the invention.

For example, a set of two fuse units also could improve an efficiency of an occupancy area as compared with a conventional case.

Furthermore, a set of more than four fuse units might be useful in order to improve a higher efficiency of an occupancy area. On the other hand, it is necessary to distinguish the resistance value of each resistors clearly in this case. Therefore more precise fabrication and accurate measurement of resistances is required.

Also, a resistor or a fuse could be formed also in a layer other than a wiring layer of multilevel interconnection.

Consequently, an optimal resistance and a thickness, etc. can be chosen for a resistance or a fuse, and a fuse elememt having high controllability can be formed. In addition, a width of a resistance or a fuse might be fixed and a film thickness of a resistance or a fuse may be changed. Moreover, a resistance can also be changed by varying both the film thickness and width.

Moreover, when changing a resistance value of resistors widely, a suitable material, such as silicon with controlling impurity concentration may be selected for higher resistance example, and another a suitable material, such as metal or an alloy for lower resistance example may be selected.

Both a monolayer and a multilayer may be used for a structure of a fuse element. A suitable combination between these materials, film thicknesses and film widths could be utilized.

Furthermore, a monolayer metal, a metal material, and a conductive material with a probability of laser melting are used for fuse materials.

It may be possible that a resistance value of a fuse may be close similar to resistance value of a resistor.

Moreover, a fuse and a resistor might be connected indirectly through a middle conductive wiring between a first conductive wiring and a second conductive wiring. A fuse or a resistor might be bent in the connection.

What is claimed is:

1. A semiconductor device, comprising:
   a semiconductor substrate having a circuit element;
   an insulating layer provided on the semiconductor substrate;
   a fuse element formed in the insulating layer, having at least two resistors and at least two fuses;
   the resistors formed of a first conductive wiring, connected in series;
   the fuses formed of a second conductive wiring, connected in series and disposed above the resistors; and
   a contact plug configured to connect between each of the two resistors and each of the two fuses,
   wherein the fuse element stores information by assigning a resistance of the fuse element to a bit.

2. The semiconductor device according to claim 1, wherein the fuses are disposed in a longitudinal direction directly above the resistors.

3. The semiconductor device according to claim 1, wherein the fuses are disposed off-alignment in a longitudinal direction above the resistors.

4. The semiconductor device according to claim 1, wherein at least two of the resistors have different resistance values.

5. The semiconductor device according to claim 4, wherein the different resistance values are formed by varying a width of the first conductive wiring.

6. The semiconductor device according to claim 1, wherein the second conductive wiring is made of metal or metal alloy.

7. The semiconductor device according to claim 1, wherein the first conductive wiring is made of silicon.

8. A semiconductor device, comprising:
   a semiconductor substrate having a circuit element;
   an insulating layer provided on the semiconductor substrate;
   a fuse element formed in the insulating layer, the fuse element including at least two fuse units connected in series; and
   each of the fuse units having a resistor and a fuse connected in parallel, the fuse disposed above the resistor,
   wherein the fuse element stores information by assigning a resistance of the fuse element to a bit.

9. The semiconductor device according to claim 8, wherein the second conductive wiring is made of metal or metal alloy.

10. The semiconductor device according to claim 8, wherein the first conductive wiring is made of silicon.

11. The semiconductor device according to claim 8, wherein the fuse is disposed in a longitudinal direction directly above the resistor.

12. The semiconductor device according to claim 8, wherein the fuse is disposed off-alignment in a longitudinal direction above the resistor.

* * * * *